United States Patent
Aldana

(10) Patent No.: US 7,693,234 B2
(45) Date of Patent: Apr. 6, 2010

(54) METHOD AND APPARATUS FOR INTERLEAVING IN A WIRELESS COMMUNICATION SYSTEM

(75) Inventor: Carlos Aldana, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 942 days.

(21) Appl. No.: 11/359,460

(22) Filed: Feb. 23, 2006

(65) Prior Publication Data

US 2007/0019747 A1  Jan. 25, 2007

Related U.S. Application Data

(60) Provisional application No. 60/701,478, filed on Jul. 22, 2005.

(51) Int. Cl.
*H04B 7/02* (2006.01)
*H04L 27/00* (2006.01)

(52) U.S. Cl. .................................. 375/299; 375/267
(58) Field of Classification Search ............... 375/260, 375/267, 299; 341/81
See application file for complete search history.

(56) References Cited

U.S. PATENT DOCUMENTS

| 2005/0058217 A1* | 3/2005 | Sandhu et al. | 375/267 |
| 2005/0283705 A1* | 12/2005 | McNamara | 714/755 |
| 2006/0227892 A1* | 10/2006 | Ouyang et al. | 375/267 |

* cited by examiner

*Primary Examiner*—Betsy L Deppe
(74) *Attorney, Agent, or Firm*—Sterne, Kessler, Goldstein & Fox PLLC

(57) ABSTRACT

The method and apparatus in accordance with the present invention receives bits, writes the bits row-by-row in a matrix, reads the bits column-by-column from the matrix, groups and rotates the bits read column-by-column from the matrix so as to evenly separate the bits in position, frequency, space over one symbol period.

20 Claims, 10 Drawing Sheets

Tones 1 through 12

| 0 | 64 | 128 | 17 | 81 | 145 | 2 | 66 | 130 | 19 | 83 | 147 |
| 16 | 80 | 144 | 1 | 65 | 129 | 18 | 82 | 146 | 3 | 67 | 131 |
| 32 | 96 | 160 | 49 | 113 | 177 | 34 | 98 | 162 | 51 | 115 | 179 |
| 48 | 112 | 176 | 33 | 97 | 161 | 50 | 114 | 178 | 35 | 99 | 163 |

• • • •

Tones 13 through 24

| 4 | 68 | 132 | 21 | 85 | 149 | 6 | 70 | 134 | 23 | 87 | 151 |
| 20 | 84 | 148 | 5 | 69 | 133 | 22 | 86 | 150 | 7 | 71 | 135 |
| 36 | 100 | 164 | 53 | 117 | 181 | 38 | 102 | 166 | 55 | 119 | 183 |
| 52 | 116 | 180 | 37 | 101 | 165 | 54 | 118 | 182 | 39 | 103 | 167 |

• • • •

Tones 25 through 36

| 8 | 72 | 136 | 25 | 89 | 153 | 10 | 74 | 138 | 27 | 91 | 155 |
| 24 | 88 | 152 | 9 | 73 | 137 | 26 | 90 | 154 | 11 | 75 | 139 |
| 40 | 104 | 168 | 57 | 121 | 185 | 42 | 106 | 170 | 59 | 123 | 187 |
| 56 | 120 | 184 | 41 | 105 | 169 | 58 | 122 | 186 | 43 | 107 | 171 |

• • • •

Tones 37 through 48

| 12 | 76 | 140 | 29 | 93 | 157 | 14 | 78 | 142 | 31 | 95 | 159 |
| 28 | 92 | 156 | 13 | 77 | 141 | 30 | 94 | 158 | 15 | 79 | 143 |
| 44 | 108 | 172 | 61 | 125 | 189 | 46 | 110 | 174 | 63 | 127 | 191 |
| 60 | 124 | 188 | 45 | 109 | 173 | 62 | 126 | 190 | 47 | 111 | 175 |

METHOD AND APPARATUS FOR INTERLEAVING IN A WIRELESS COMMUNICATION SYSTEM

CROSS-REFERENCE TO RELATED APPLICATION

This application claims the benefit of U.S. Provisional Application No. 60/701,478 filed Jul. 22, 2005, which is incorporated herein by reference.

FIELD OF THE INVENTION

This invention is generally related to wireless communication and more specifically to interleaving.

BACKGROUND OF THE INVENTION

The wireless communications industry has experienced an explosive growth in the last decade. However, the available spectrum for wireless communications has not grown at the same rate. Increased cost of acquiring spectrum to accommodate users has resulted in an increased interest in spectrum efficient techniques that use multiple transmit and receive antennas instead of the conventional single transmit and receive antennas.

In conventional wireless communications, a single antenna is used at the source and the destination. In some cases, this gives rise to problems with multipath effects. When an electromagnetic field is met with obstructions such as hills, canyons, buildings, and utility wires, the wavefronts are scattered, and thus they take many paths to reach the destination. The late arrival of scattered portions of the signal causes problems such as fading, cut-out (cliff effect), and intermittent reception (picket fencing). In digital communications systems such as wireless internet, these problems can cause a reduction in data speed and an increase in the number of errors. The use of two or more antennas, along with the transmission of multiple signals (one for each antenna) at the source and the destination, can take advantage of the multipath wave propagation.

One of the most promising spectrum efficient techniques are multiple-input, multiple-output (MIMO) systems. MIMO is an antenna technology for wireless communications in which multiple antennas are used at both the source (transmitter) and the destination (receiver). The antennas at each end of the communications circuit are combined to minimize errors and optimize data speed. These systems exploit the spatial dimension to a larger extent than previous systems and have been shown to be capable of supporting very high data rates without increasing the bandwidth. MIMO is a reliable technique and has been put into practice in production of WLANS. MIMO is one of several forms of smart antenna technology, the others being Multiple Input Single Output (MISO) and Single Input Multiple Output (SIMO). MIMO technology has aroused interest because of its possible applications in digital television (DTV), WLANs, metropolitan area networks (MANs), and mobile communications.

What are needed, therefore, are methods and systems for more fully utilizing multiple transmit and/or multiple receive paths.

BRIEF SUMMARY OF THE INVENTION

The present invention is directed to a method and apparatus for interleaving bits in a multi-path wireless communications system. The invention comprises a method and apparatus for receiving bits, writing the bits row-by-row in a matrix, reading the bits column-by-column from the matrix, and grouping and rotating the bits read from the matrix so as to separate the bits by position, frequency, and by streams, over one symbol period.

Additional features and advantages of the invention will be set forth in the description which follows, and in part will be apparent from the description, or may be learned by practice of the invention.

It is to be understood that both the foregoing general description and the following detailed description are exemplary and explanatory and are intended to provide further explanation of the invention as claimed. The detailed description is not intended to limit the scope of the claimed invention in any way.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings:

FIG. 6 illustrates results produced by a Quadrature Amplitude Modulation (QAM) interleaver.

Figure 1A:
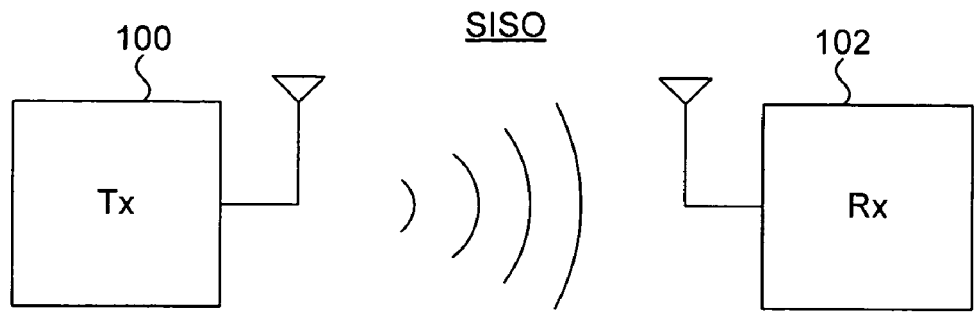
FIG. 1A is a block diagram of a SISO transmitter and receiver.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

The present invention will be described in terms of an embodiment applicable to the pre-processing of encoded transmission data using an interleaver. It will be understood that the essential pre-processing concepts disclosed herein are applicable to a wide range of electronic systems, architectures and hardware elements. Thus, although the invention will be disclosed and described in terms of pre-processing transmission data for a wireless system to increase transmission reliability, the invention is not limited to this field.

Interleaving is a key component of many digital communication systems involving forward error correction (FEC) coding. Interleaving encoded symbols provides a form of time and/or frequency diversity to guard against localized corruption or bursts of errors. The role of interleaving is to randomize the bits, so that error events due to deep channel fades are maximally de-correlated. If the interleaver has sufficient depth the fading processes that affect successive symbols belonging to the same codeword will be uncorrelated. Therefore, from the perspective of any single codeword, interleaving makes a burst error channel appear as one which has only random errors.

In the Institute of Electrical and Electronics Engineers (IEEE) 802.11a standard, a block interleaver is specified where encoded bits in one Orthogonal Frequency Division Multiplexed (OFDM) symbol are uniformly permuted across all bit positions in the constellation. The IEEE wireless LAN standards 802.11a, 802.11g and Hiperlan/2 are all OFDM based and use 48 data sub-carriers and 4 pilot tones. They also use the same interleaving scheme. The interleaving scheme is defined by two permutations. The first permutation ensures that adjacent bits are modulated onto nonadjacent sub-carriers and the second permutation ensures that that adjacent bits are mapped alternatively onto less and more significant bits of the constellation.

The type of interleaving chosen for a transmission system is a function of the type of the channel and the coding technique used. In Gaussian channels, the error distribution cannot be changed by relocating the bits, so interleaving is not useful. Frequency and time interleaving are the most common forms of interleaving.

Frequency interleaving is used to exploit the frequency diversity in wide-band transmissions. After frequency interleaving, the local deep fading is averaged over the whole bandwidth of the system. Frequency interleaving should be implemented for all the data symbols in a single OFDM symbol. This means, that the data symbols of two neighboring OFDM symbols should not be interleaved in one iteration. For this reason, the dimension of a conventional frequency interleaver is equal to the number of data symbols in a single OFDM symbol i.e. number of tones (K)×number of bits/tone (B). Frequency Interleaving is used in IEEE 802.11a standard, where the depth has been defined to be equal to one OFDM symbol providing an important improvement of the system. The combined effect of interleaving and convolution channel coding takes advantage of the frequency diversity provided by the wideband nature of the transmitted signal.

Time interleaving is used to exploit the time diversity of the channel. After time interleaving, the local time deep fading in some OFDM symbols is averaged over all OFDM symbols. The time interleaving depth should be larger than the maximum burst-error in the time domain. Time interleaving is usually not applied in WLAN systems, because of the slowly fading characteristics of the channel.

Antenna technology used in a wireless transmission system can be categorized into four broad categories. FIG. 1A shows a Single Input Single Output (SISO) transmission system. SISO refers to a wireless communications system in which one antenna is used at the source i.e. the transmitter 100 and one antenna is used at the destination i.e. the receiver 102. In some environments, SISO systems are vulnerable to problems caused by multipath effects such as fading, cut-out and intermittent reception. SISO systems have only one antenna and can transmit and receive only one stream of data thereby suffering from multipath effects.

In order to minimize or eliminate problems caused by multipath wave propagation, smart antenna technology is used. A smart antenna is a digital wireless communications antenna system that takes advantage of diversity effect at the source (transmitter), the destination (receiver), or both. Diversity effect involves the transmission and/or reception of multiple radio frequency (RF) waves or multiple data streams to increase data speed and reduce the error rate. The next three categories in antenna technology belong to the smart antenna arena and have been introduced above as SIMO, MISO and MIMO.

Figure 1B:
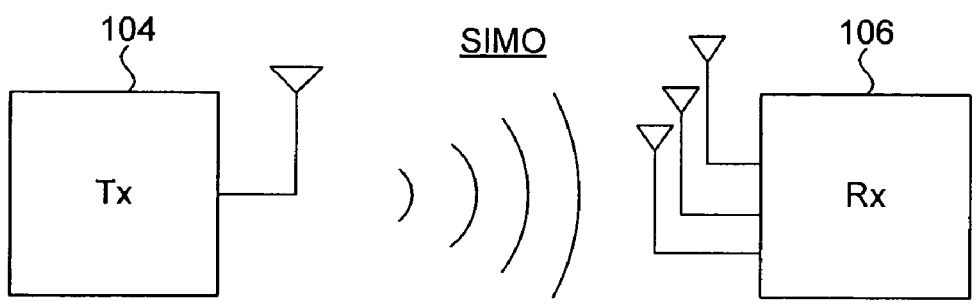
FIG. 1B is a block diagram of a SIMO transmitter and receiver.

FIG. 1B shows a SIMO transmitter 104 and receiver 106. In SIMO systems a single antenna is used at the transmitter 104 and multiple antennas are used at the receiver 106. The output of the antennas are combined to minimize errors and optimize data speed. The transmitter 104 has only one antenna thereby allowing transmission of only one data stream, while the receiver 106 can receive multiple data streams. SIMO technology has widespread applications in DTV, WLANs, MANs and mobile communications among others. An early form of SIMO, known as diversity reception, has been used by military, commercial, amateur, and shortwave radio operators at frequencies below 30 MHz since the First World War.

Figure 1C:
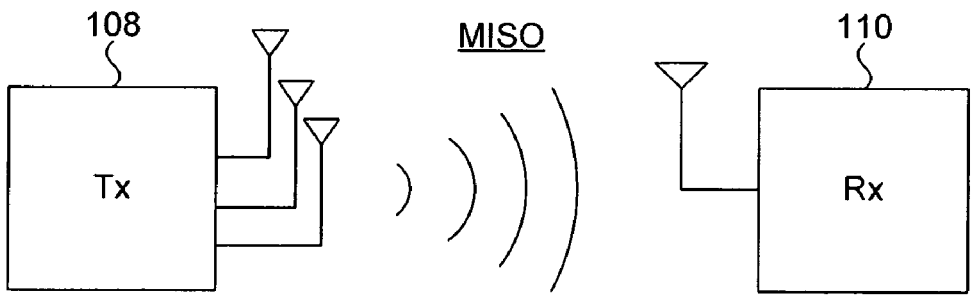
FIG. 1C is a block diagram of a MISO transmitter and receiver.

FIG. 1C shows a MISO transmitter 108 and receiver 110. MISO is an antenna technology for wireless communications in which multiple antennas are used at the transmitter 108. The output of the antennas are combined to minimize errors and optimize data speed. MISO technology allows transmission of multiple data streams at the transmitter 108 but will allow only single data stream reception at the receiver 110. MISO technology also has widespread applications in DTV, WLANs, MANs and mobile communications among others.

Figure 1D:
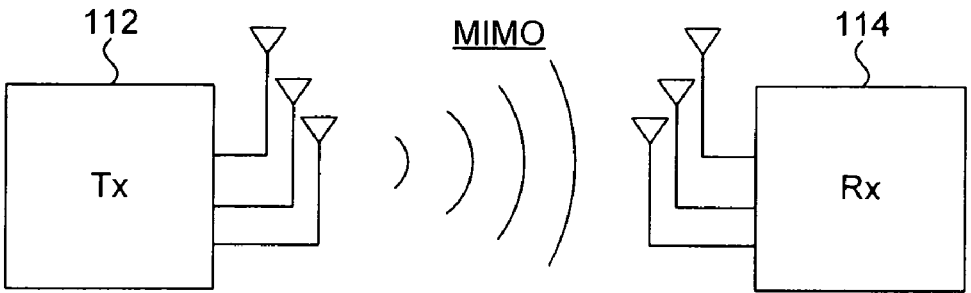
FIG. 1D is a block diagram of a MIMO transmitter and receiver.

FIG. 1D shows a MIMO transmitter 112 and receiver 114. MIMO systems are a promising new way of more fully utilizing the spatial dimension of a channel by employing multiple antennas at both the transmitter 112 and the receiver 114. As used herein, channel refers to an available frequency spectrum. MIMO systems have been shown to support much higher data rates than traditional single antenna systems while using the same amount of bandwidth or channel. This increase is achieved by taking advantage of the multiple paths that most signals take between the transmitter and the receiver, rather than suffering from it. MIMO technology allows multiple data stream transmission at the transmitter 112 and also allows multiple data stream reception at the receiver 114.

Figure 2:
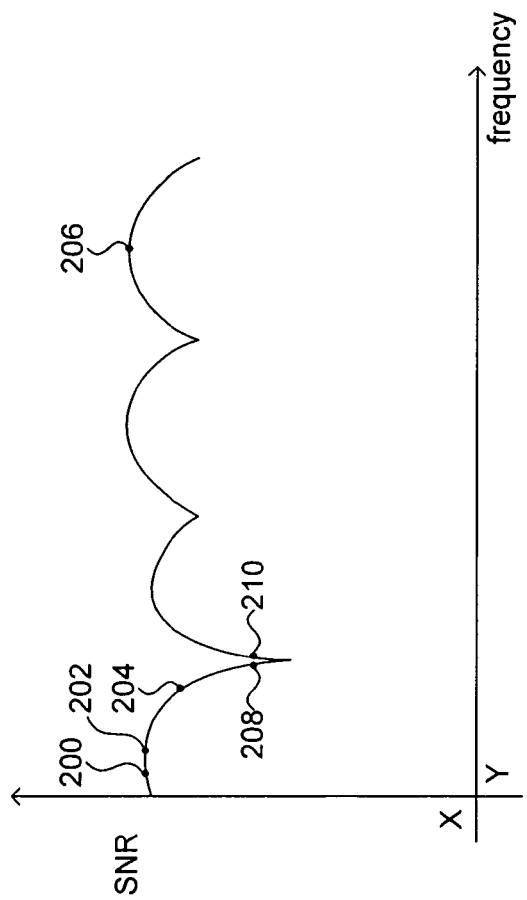
FIG. 2 is a frequency vs. Signal-to-Noise Ratio (SNR) graph of data points.

In order to increase reliability, data bits are spread in frequency and/or position. FIG. 2. is a frequency diagram of a channel of frequencies or tones, modulated with bit pairs 200 and 202, 204 and 206, 208 and 210. The X-axis represents frequency and the Y-axis represents the SNR. Bits 200, 202, 208, and 210 are spaced by a first interleaving scheme that places adjacent bits near the same tone or frequency. In other words, adjacent bits have not been separated across position or frequency. This is generally undesirable because if the tone is subject to interference, related bits will likely both be lost. For example, adjacent bits 208 and 210 have been placed near the same tone in a part of the signal having a very low SNR. Thus, if that part of the signal is lost due to interference, adjacent bits 208 and 210 cannot be recovered because during error correction at the receiver, at least one bit of an adjacent bit pair is required to recover a lost signal.

Adjacent bits 204 and 206, on the other hand, have been spaced apart from one another by position and multiple tones or frequencies. As a result, the probability of both bits being lost during transmission is thereby significantly reduced.

However with multiple antennas as in MIMO systems, multiple data streams can be transmitted and hence we require an interleaver that can spread bits across frequencies, streams and in position thereby increasing transmission reliability. Furthermore, to reduce transmission latency, the bits should be interleaved across a single symbol period instead of multiple symbol periods.

In accordance with an embodiment of the invention, data streams are interleaved across space, as well as frequency and position. In other words, adjacent data bits are spread across multiple transmit streams or paths. The data bits are optionally transmitted within a given symbol period over the multiple paths. Spreading the bits across multiple transmit streams can prevent long runs of low reliability (LSB) bits.

Figure 3:
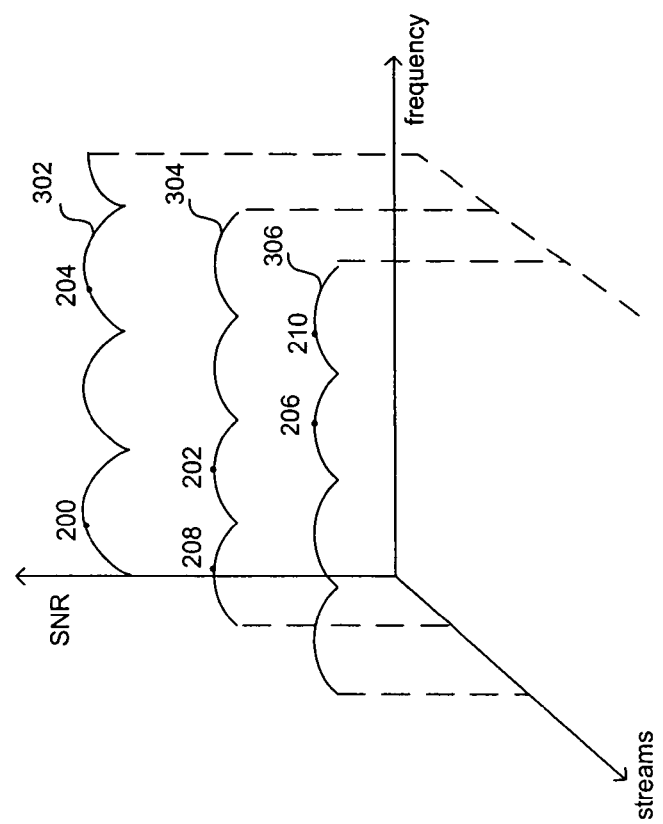
FIG. 3 is a frequency vs. SNR vs. number of streams graph of data points.

FIG. 3. is an example graph of data bits 200-210, interleaved across multiple transmit data streams 302, 304, and 306. The X-axis represents frequency, the Y-axis represents the SNR and the Z-axis represents the streams of data.

In accordance with an aspect of the invention, a novel interleaving scheme is provided that more fully utilizes the available channel and data paths.

Figure 4:
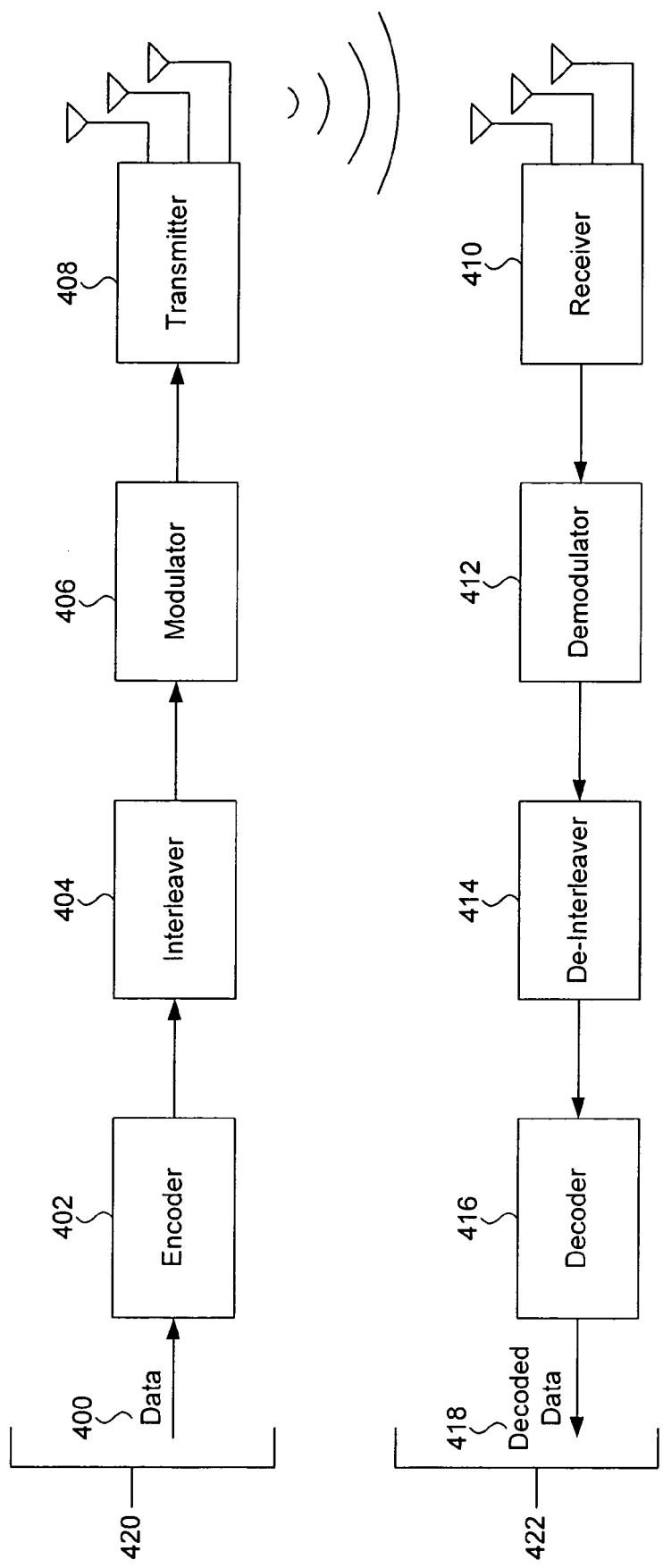
FIG. 4 is a block diagram of transmission and reception portions of a wireless communication system.

FIG. 4 is block diagram of an example communication system. FIG. 4 including a transmit portion 420 and a receive portion 422. The transmit portion 420 receives a bit stream 400 that is to be transmitted. The transmit portion 420 includes an encoder 402, an interleaver 404, a modulator 406, and a transmitter 408. The receive portion 422 includes a receiver 410, a demodulator 412, a de-interleaver 414, and a decoder 416. The receive portion 422 outputs a decoded data 418.

The encoder 402 encodes the bit stream 400 into a form that is acceptable for transmission. This is usually done by implementing an algorithm. The interleaver 404 randomizes the encoded bits received from the encoder 402, so that error events due to deep channel fades are maximally de-correlated.

The modulator 406 encodes the interleaved bits on a carrier signal which is typically a sine-wave signal. Modulation techniques include but are not limited to Phase Modulation (which includes Binary Phase Shift Keying (BPSK), Quarternary Phase Shift Keying (QPSK)), Single-Sideband modulation (SSB), Vestigial-Sideband modulation (VSB, or VSB-AM), Quadrature Amplitude Modulation (QAM), OFDM, also known as Discrete multitone modulation (DMT), Wavelet modulation, Trellis modulation, Adaptive modulation and Sigma-delta modulation (ΣΔ).

The transmitter 408, in conjunction with a transmit antenna, propagates the modulated signal such as radio, television, or other telecommunications. The transmitter 408 typically includes a power supply, an oscillator, and amplifiers for audio frequency (AF), intermediate frequency (IF) and radio frequency (RF) depending upon the type of transmission.

The receiver 410, in conjunction with a receive antenna, receives the transmitted wireless signal from the transmitter 408 and converts it to a suitable format for the next processing stage i.e. the demodulator 412. The demodulator 412 recovers the information content from the carrier wave of the signal recovered by the receiver 410. The de-interleaver 414 recovers the randomized encoded bits received from the de-modulator.

The de-interleaver 414 needs to be synchronized with the interleaver 404. This can be performed by inserting a periodic unique sequence (unique word) after interleaving. This unique word is detected at the receiver to recover the start of frame synchronization. The unique word is generally not subjected to interleaving.

The decoder 416 reverses the encoding performed by the encoder 402 so that the original information can be retrieved.

Methods and systems for interleaving are now described.

Figure 5:
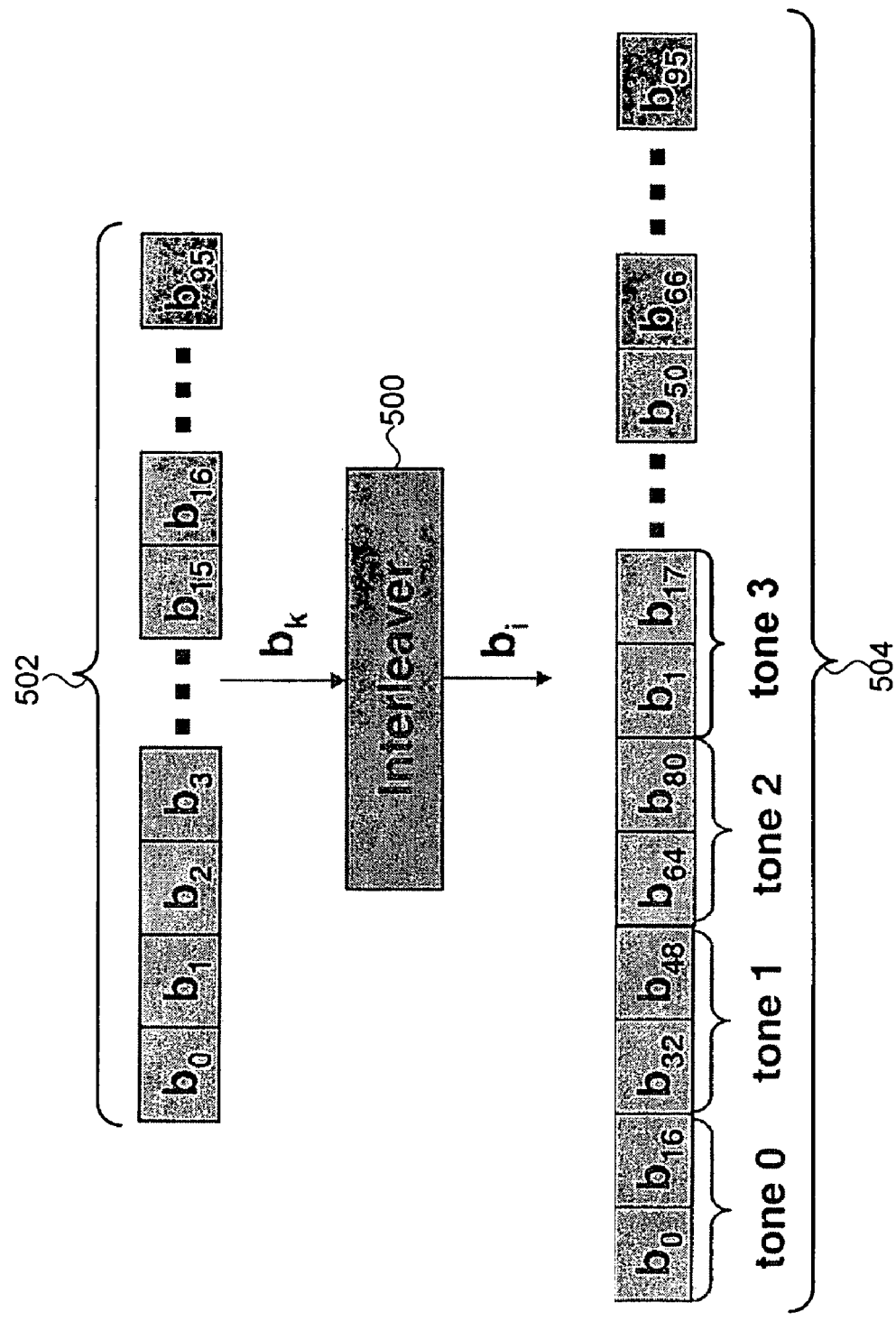
FIG. 5 shows bits interleaved by a Quarternary Phase Shift Keying (QPSK) interleaver.

FIG. 5 shows bits interleaved by a conventional 802.11a QPSK interleaver 500. The QPSK interleaver 500 receives an encoded bitstream $b_k$ from the encoder 402. The bits in the bit stream $b_k$ are in their encoded order 502. The QPSK interleaver 500 randomizes the bitstream $b_k$ to produce the interleaved bit stream $b_i$. The formula used to randomize the bitsteam $b_k$ is defined as:

$$i = 6(k \bmod r) + \left\lfloor \frac{k}{r} \right\rfloor \text{ where } k = 0, 1, 2 \ldots 47 \quad (1)$$

Where,
i is the position where the $k^{th}$ bit should be placed,
k is the bit index, and
r is the number of columns in the interleaver,.

In an example where r=16, bit 0 is placed in position 0, bit 1 is placed in the $6^{th}$ position and bit 16 is placed in the $1^{st}$ position et cetera.

The interleaved bits 504 are then grouped and transmitted on separate tones to improve transmission reliability as explained above. Bits $b_0$ and $b_{16}$ are transmitted on tone 0, bits $b_{32}$ and $b_{48}$ on tone 1, bits $b_{64}$ and $b_{80}$ on tone 2 and bits $b_1$ and $b_{17}$ on tone 3. Thus, the QPSK interleaver 500 separates adjacent bits $b_0$ and $b_1$ by at least 3 tones as shown in FIG. 5. The QPSK interleaver 500 separates adjacent bits in position and frequency. The size of the legacy QPSK interleaver 500 is defined as:

$$N_{CBPS} = B*K$$

Where,
$N_{CBPS}$ is the number of coded bits per symbol
B is the number of bits/tone and
K is the number of tones.

For example, in FIG. 5, B=2 and K=48. The size of the QPSK interleaver 500 is therefore 96 bits.

FIG. 6 shows bits interleaved by a 16 QAM interleaver across 48 tones. As seen in FIG. 6, adjacent bits bit 0 and bit 1 are transmitted on separate tones. Bit 0 is transmitted on tone 1 and bit 1 is transmitted on tone 4 allowing a 3 tone separation between the bits and thereby providing better protection to adjacent bits. Thus for example if the first three tones experience a fade, only bits 0, 64 and 128 will be lost. Since their adjacent bits 1, 65 and 129 are on separate tones (with at least 3 tone separation), there is a high probability that these bits will be received and can be used to recover the lost bits 0, 64 and 128 by the error correction scheme used at the transceiver.

The interleaving schemes shown in FIGS. 5 and 6 interleave bits in position and frequency, as shown in FIG. 2. With a MIMO system providing multiple transmitter 112 and receiver 114 antennas, bits can be interleaved across frequency, postion and space as shown in FIG. 3. In an embodiment, adjacent bits are spread across only one symbol period instead of multiple symbol periods as is done by conventional interleavers.

Figure 7:
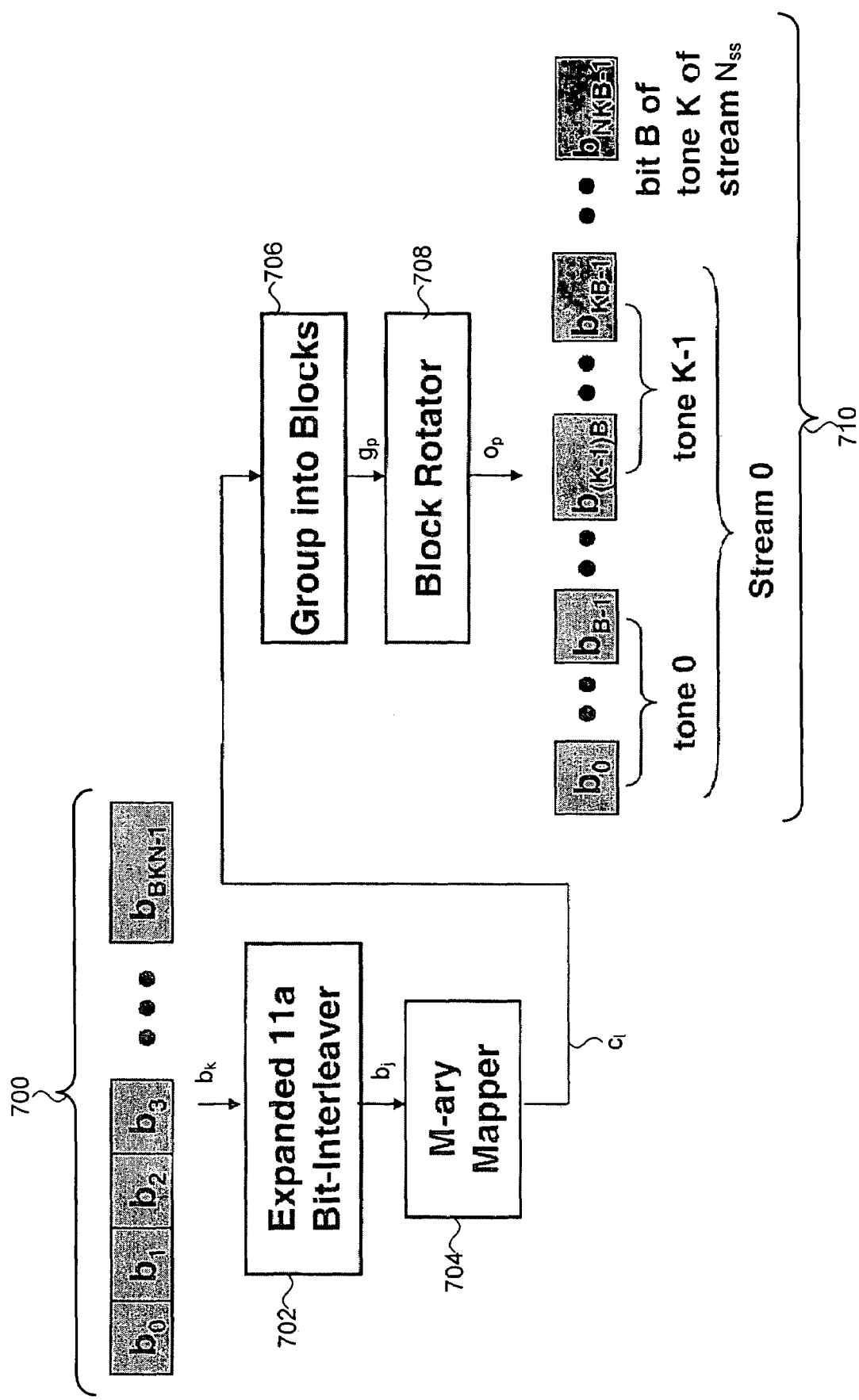
FIG. 7 is a block diagram of an exemplary interleaver.

FIG. 7 is an exemplary embodiment of the interleaver 404 that spreads bits over one symbol period and across streams, frequency and position. FIG. 7 shows encoded bits 700, a row-column interleaver 702, a M-ary bit mapper 704, a block converter 706, a block rotator 708 and interleaved bits 710. Encoded bits $b_0$ to $b_{BKN-1}$ 700 are bits received from the encoder 402. The encoded bit stream $b_k$ is processed by the row-column bit interleaver 702. The row column interleaver 702 writes the encoded bit stream $b_k$ row by row and reads them out column by column. An embodiment of the row column interleaver 702 according to the invention and the permutations performed on bit stream $b_k$ will be discussed in greater detail later in the application. The result from the row column interleaver 702 is bit stream $b_j$ which is fed into a M-ary mapper 704, that groups $N_{BPSC}$ (number of bits per sub-carrier) bits together to produce M-ary subsymbols $c_l$. The permutations performed on bit stream $b_j$, where the number of streams is $N_{SS}$, are defined as:

$$c_l = [b_{lB} b_{lB+1} \ldots b_{lB+B-1}], \text{ where } l=0, 1, \ldots, N_{ss}K-1 \qquad (2)$$

Next, the M-ary subsbymbols $c_l$ are further grouped into a number of streams ($N_{SS}$)×t groups, each group having K/t subsymbols to produce blocks $g_p$ where t is a block rotation parameter and a function of the number of tones K. For example, if $N_{SS}$=2, t=K; for $N_{SS}$=3, t=K and for $N_{SS}$=4, t=K/2. The values for all parameters described herein are example embodiments and should in no way limit the parameters to these values.

The permutations performed on subsymbols $c_l$ are defined by:

$$g_p = \left[ c_{p\frac{K}{t}} c_{p\frac{K}{t}+1} \ldots c_{p\frac{K}{t}+\frac{K}{t}-1} \right], \text{ where } p = 0, 1, \ldots, N_{ss}t - 1 \qquad (3)$$

Lastly the blocks $g_p$ are rotated by the block rotator 708 to introduce greater separation between adjacent bits and produce the a stream of block $o_p$. The permutations used to produce block stream $o_p$ are governed by the number of streams in use. The permutations performed on block stream $g_p$ for two transmit streams are defined as:

$$o_p = \begin{cases} g_p, & \text{where } p = 0, 2, \ldots, N_{SS}t - 2 \\ g_{(p+t) \bmod N_{SS}t}, & \text{where } p = 1, 3, \ldots N_{SS}t - 1 \end{cases} \qquad (4)$$

The permutations performed on block stream $g_p$ for three transmit streams are defined as:

$$o_p = \begin{cases} g_p, & \text{where } p = 0, 2, 4, 6, \ldots, N_{SS}t - 2 \\ g_{(p+t) \bmod N_{SS}t}, & \text{where } p = 1, 5, 9, \ldots, N_{SS}t - 3 \\ g_{(p+2t) \bmod N_{SS}t}, & \text{where } p = 3, 7, 11, \ldots, N_{SS}t - 1 \end{cases} \qquad (5)$$

The permutations performed on block stream $g_p$ for four transmit streams are defined as:

$$o_p = \begin{cases} g_p, & \text{where } p = 0, 4, 8, \ldots, N_{SS}t - 4 \\ g_{(p+t) \bmod N_{SS}t}, & \text{where } p = 1, 5, 9, \ldots, N_{SS}t - 3 \\ g_{(p+2t) \bmod N_{SS}t}, & \text{where } p = 2, 6, 10, \ldots, N_{SS}t - 2 \\ g_{(p+3t) \bmod N_{SS}t}, & \text{where } p = 3, 7, 11, \ldots, N_{SS}t - 1 \end{cases} \qquad (6)$$

Interleaved bits $b_0$ to $b_{NKB-1}$ 710 show how the bits within the block stream $o_p$ have been separated by position, frequency (tones) and space (streams). In this example bits $b_0$ to $b_{B-1}$ are on tone 0 and bits $b_{(k-1)B}$ to $b_{KB-1}$ are on tone K−1. There are K tones (0 to K−1) and bits $b_0$ to $b_{KB-1}$ on stream 0. The remaining bits $b_{KB}$ to $b_{NKB-1}$ are repeatedly divided amongst K tones and are on separate streams with $b_{NKB-1}$ being bit B of tone K of stream $N_{SS}$. The encoded bit stream 700 has now been interleaved 710 across frequency, position, space and spread over one symbol period to generate interleaved bits 710 for transmission from multiple antennas.

Figure 8:
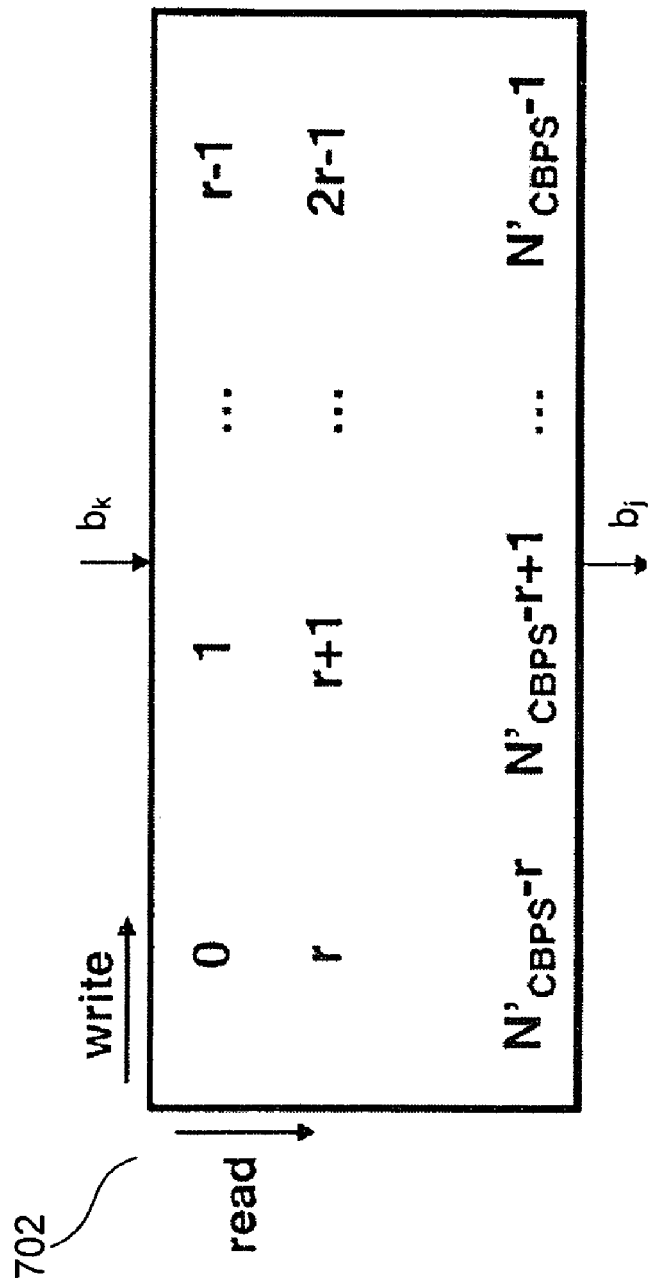
FIG. 8 is a diagram of a row-column interleaver.

FIG. 8 shows the row-column interleaver 702 matrix according to an embodiment of the present invention. The size of the row-column interleaver is given by:

$$N'_{CBPS} = N_{SS} \times K \times B$$

where $N'_{CBPS}$ is the number of coded bits per symbol
$N_{SS}$ is the number of streams
K is the number of tones/stream
and B is the number of bits/tone The row-column interleaver 702 has r columns and $N'_{CBPS}/r$ rows. The bit stream $b_k$ is written row-by-row and read out column-by-column as bit stream $b_j$. The reverse process is performed at the de-interleaver 414 to recover the original order of the transmitted bits. The row-column interleaver 702 is defined by a two-step permutation. In the equations below, k denotes the index of the bit before the first permutation, i denotes the index after the first but before the second permutation, j denotes the index after the second permutation and $N'_{CBPS}$ is the total number of bits to be transmitted. The two permutations are given by:

$$i = \frac{N'_{CBPS}}{r}(k \bmod r) + \left\lfloor \frac{k}{r} \right\rfloor, \qquad (7)$$

where $k = 0, 1, \ldots N'_{CBPS} - 1$ and $$j = s \left\lfloor \frac{i}{s} \right\rfloor + \left( i + N'_{CBPS} - \left\lfloor \frac{ri}{N'_{CBPS}} \right\rfloor \right) \bmod s, \qquad (8)$$

where $i = 0, 1, \ldots N'_{CBPS} - 1$

The first permutation ensures that adjacent bits are mapped onto nonadjacent tones and non-adjacent streams. The second permutation ensures that adjacent bits are mapped alternately onto less and more significant bits of the constellation, thereby avoiding long runs of low reliability (LSB) bits. The number of columns (r) is a design parameter that can be varied. However, r between 17 and 47 yields the best results for interleaving the bits across frequency, space and position. In an embodiment of the invention, r=24 yields optimal results. In legacy SISO devices, a typical value for r is 16.

Figure 9:
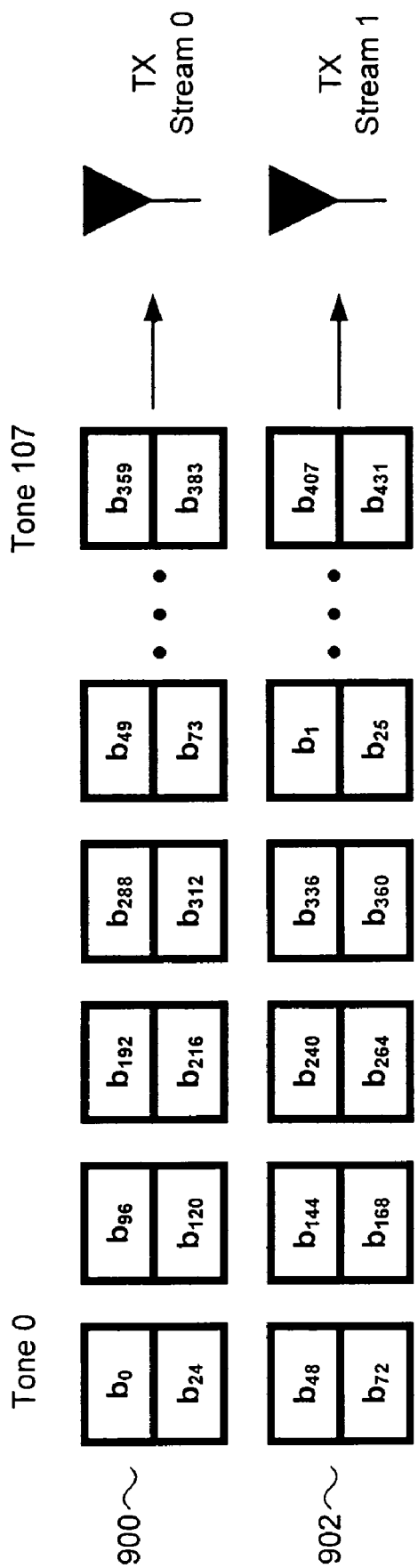
FIG. 9 illustrates results produced by an interleaver for a two stream transmission system.

FIG. 9 shows the interleaved result produced by an embodiment of the invention. FIG. 9 shows bits interleaved in pairs of B=2 bits/tone, across K=108 tones/stream and $N_{SS}$=2 streams. The first row 900 has paired bits that are transmitted on stream 1 and the second row 902 has paired bits that are transmitted on stream 2. The size of the row-column interleaver used to produce the results in FIG. 9 is $N'_{CBPS} = N_{SS} \times K \times B = 2 \times 48 \times 2 = 432$ bits. The interleaver 404 used to generate these results has r=24 columns as a design parameter in the row-column matrix 702. The design parameter of 24 columns when used with 108 tones with 2 bits/tone leads to at least four tone and one stream separation between adjacent bits. As can been in FIG. 9, bits $b_0$ and $b_1$ have at least a four tone and one stream separation between them and are placed on alternate streams. Adjacent bits are also mapped alternately onto less and more significant bits of the constellation and thereby long runs of low reliability (LSB) bits are avoided.

Figure 10:
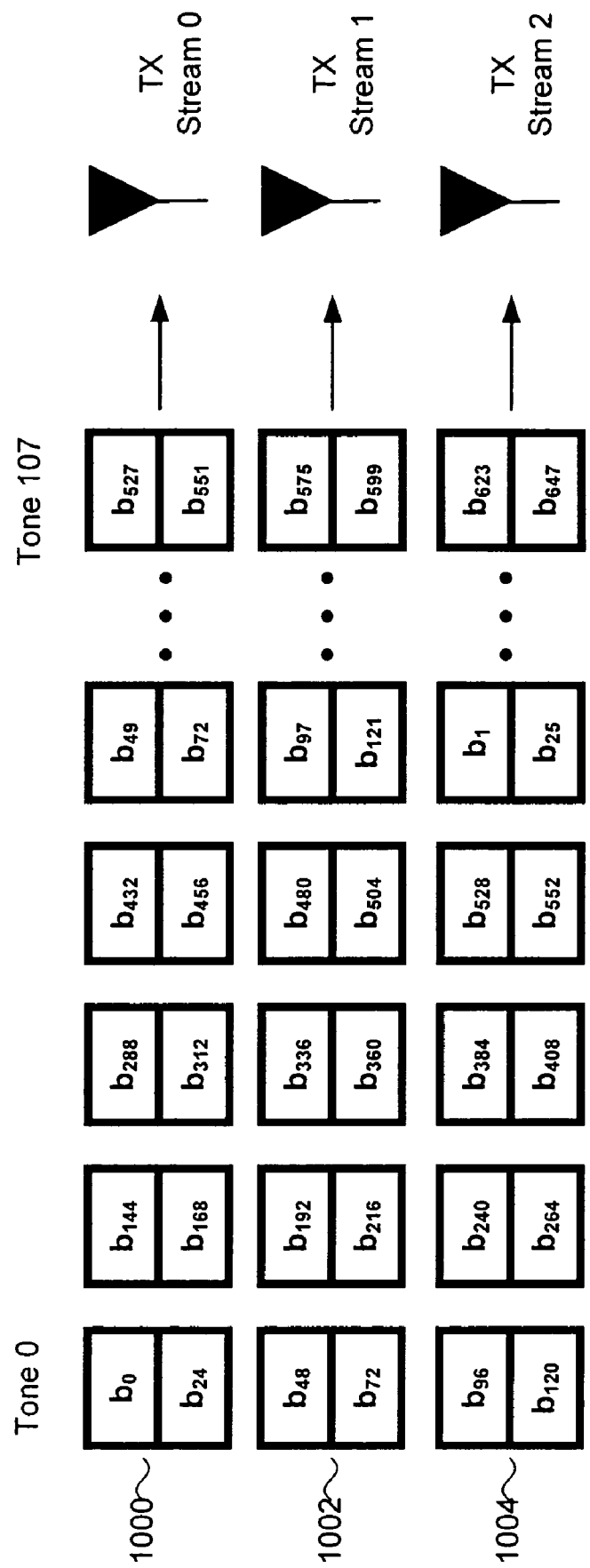
FIG. 10 illustrates results produced by an interleaver for a three stream transmission system.

FIG. 10 is another example of the interleaved result produced by an embodiment of the invention. FIG. 10 shows bits interleaved in pairs of B=2 bits/tone, across K=108 tones and $N_{SS}$=3 streams. The first row 1000 has paired bits that are transmitted on stream 1, the second row 1002 has paired bits that are transmitted on stream 2 and the third row 1004 has paired bits that are transmitted on stream 3. The size of the row-column interleaver used to generate these results is $N'_{CBPS}=N_{SS} \times K \times B=2 \times 48 \times 3=648$ bits. The interleaver 404 used to generate these results has r=24 columns as a design parameter in the row-column matrix 702. The design parameter of 24 columns when used with 108 tones with 2 bits/tone leads to at least four tone and one stream separation between adjacent bits. As can been in FIG. 10, adjacent bits bo and b, have at least a four tone and one stream separation between them and are placed on alternate streams. Adjacent coded bits are also mapped alternately onto less and more significant bits of the constellation and thereby long runs of low reliability (LSB) bits are avoided.

The embodiments presented above are described in relation to MIMO systems and wireless communications. The invention is not, however, limited to MIMO and wireless communications. Based on the description herein, a person skilled in the relevant art(s) will understand that the invention can be applied to other applications As used herein, the terms "tone", "frequency", "sub-carrier" and their plural forms are used throughout the application to denote frequencies used to transmit bits and are interchangeable with the term "frequency" as is apparent to any person skilled in the relevant art(s).

The invention has been described for transmission systems having two or three antennas and/or two or three transmission streams. The invention is not, however, limited to these example embodiments. Based on the description herein, one skilled in the relevant art(s) will understand that the invention can be applied in systems with four or more transmit antennas or a single antenna capable of transmitting multiple streams.

Figure 11:
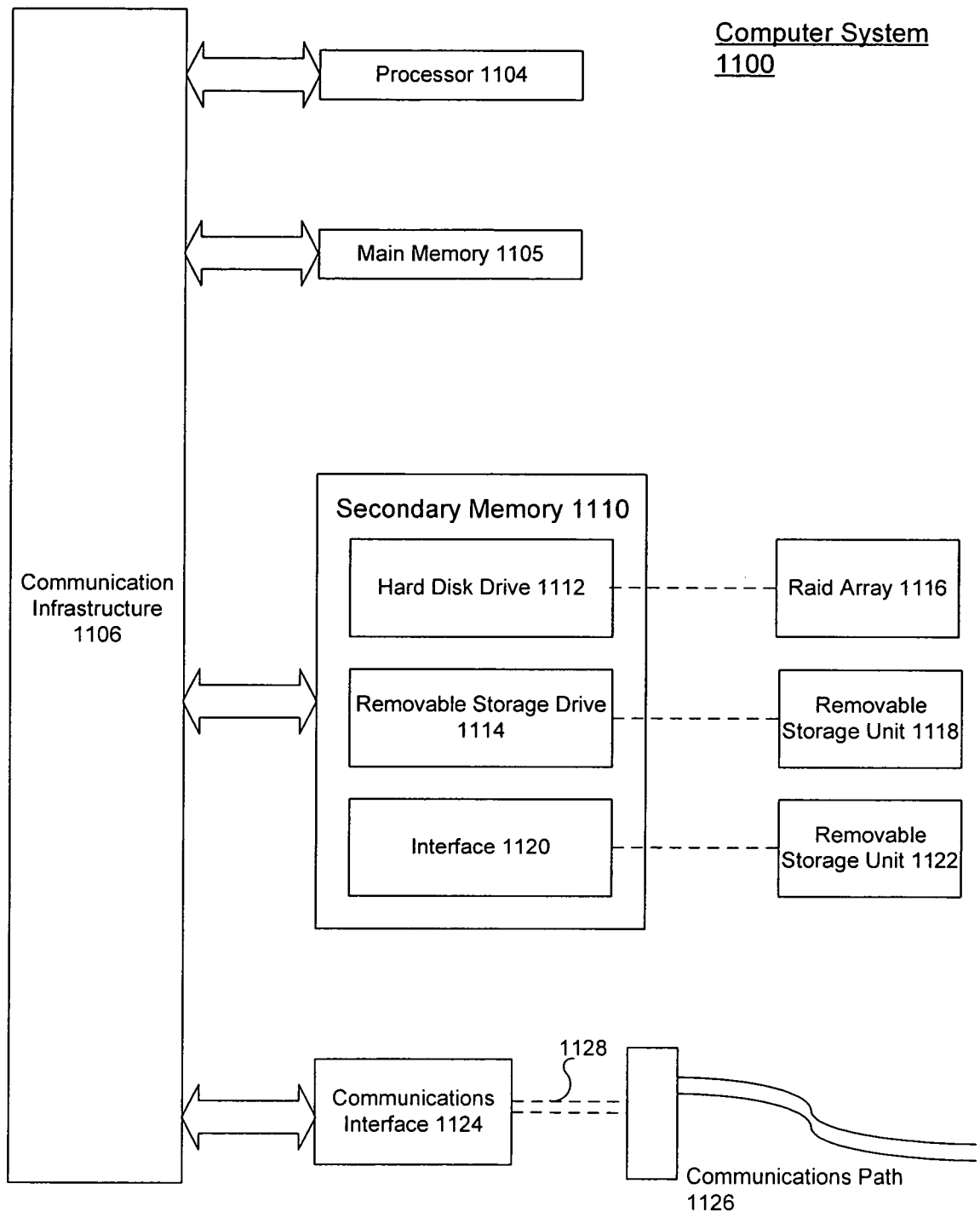
FIG. 11 is a block diagram of an exemplary computer system.

The present invention, or portions thereof, can be implemented in hardware, firmware, software, and/or combinations thereof. Consequently, the invention may be implemented in the environment of a computer system or other processing system. An example of such a computer system 1100 is shown in FIG. 11. The computer system 1100 includes one or more processors, such as processor 1104. Processor 1104 can be a special purpose or a general purpose digital signal processor. The processor 1104 is connected to a communication infrastructure 1106 (for example, a bus or network). Various software implementations are described in terms of this exemplary computer system. After reading this description, it will become apparent to a person skilled in the relevant art how to implement the invention using other computer systems and/or computer architectures.

Computer system 1100 also includes a main memory 1105, preferably random access memory (RAM), and may also include a secondary memory 1110. The secondary memory 1110 may include, for example, a hard disk drive 1112, and/or a RAID array 1116, and/or a removable storage drive 1114, representing a floppy disk drive, a magnetic tape drive, an optical disk drive, etc. The removable storage drive 1114 reads from and/or writes to a removable storage unit 1118 in a well known manner. Removable storage unit 1118, represents a floppy disk, magnetic tape, optical disk, etc. As will be appreciated, the removable storage unit 1118 includes a computer usable storage medium having stored therein computer software and/or data.

In alternative implementations, secondary memory 1110 may include other similar means for allowing computer programs or other instructions to be loaded into computer system 1100. Such means may include, for example, a removable storage unit 1122 and an interface 1120. Examples of such means may include a program cartridge and cartridge interface (such as that found in video game devices), a removable memory chip (such as an EPROM, or PROM) and associated socket, and other removable storage units 1122 and interfaces 1120 which allow software and data to be transferred from the removable storage unit 1122 to computer system 1100.

Computer system 1100 may also include a communications interface 1124. Communications interface 1124 allows software and data to be transferred between computer system 1100 and external devices. Examples of communications interface 1124 may include a modem, a network interface (such as an Ethernet card), a communications port, a PCMCIA slot and card, etc. Software and data transferred via communications interface 1124 are in the form of signals 1128 which may be electronic, electromagnetic, optical or other signals capable of being received by communications interface 1124. These signals 1128 are provided to communications interface 1124 via a communications path 1126. Communications path 1126 carries signals 1128 and may be implemented using wire or cable, fiber optics, a phone line, a cellular phone link, an RF link and other communications channels.

The terms "computer program medium" and "computer usable medium" are used herein to generally refer to media such as removable storage drive 1114, a hard disk installed in hard disk drive 1112, and signals 1128. These computer program products are means for providing software to computer system 1100.

Computer programs (also called computer control logic) are stored in main memory 1108 and/or secondary memory 1110. Computer programs may also be received via communications interface 1124. Such computer programs, when executed, enable the computer system 1100 to implement the present invention as discussed herein. In particular, the computer programs, when executed, enable the processor 1104 to implement the processes of the present invention. Where the invention is implemented using software, the software may be stored in a computer program product and loaded into computer system 1100 using raid array 1116, removable storage drive 1114, hard drive 1112 or communications interface 1124.

In another embodiment, features of the invention are implemented primarily in hardware using, for example, hardware components such as Application Specific Integrated Circuits (ASICs) and gate arrays. Implementation of a hardware state machine so as to perform the functions described herein will also be apparent to persons skilled in the relevant art(s).

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A method to process transmission data using a processor, comprising:
    a) receiving bits;
    b) writing said received bits row-by-row in a matrix;
    c) reading said bits written row-by-row in said matrix column-by-column;
    d) grouping a pre-determined number of said bits read column-by-column to form subsymbols;
    e) grouping said subsymbols to form groups of subsymbols;
    f) rotating said groups of subsymbols to form rotated groups of subsymbols;
    g) transmitting said rotated groups of subsymbols over transmit paths using antennas;
    wherein adjacent received bits in step a) are separated over frequency, position, and multiple streams when transmitted.

2. The method of claim 1, wherein adjacent bits received in step a) are separated over frequency, position, and multiple streams, and over one symbol period when transmitted.

3. The method of claim 1, wherein a size of said matrix ($N'_{CBPS}$) is defined as:

$$N'_{CBPS} = N_{SS} \times K \times B;$$

wherein,
$N_{SS}$ is the number of streams;
K is the number of tones/stream and
B is the number of bits/tone.

4. The method of claim 1, wherein a number of columns (r) in said matrix is greater than or equal to 17 and less than or equal to 47.

5. The method of claim 1, wherein a number of columns (r) in said matrix is 24.

6. The method of claim 1, step (d) further comprising the step of mapping adjacent received bits onto nonadjacent tones and non-adjacent streams using a first permutation.

7. The method of claim 6, step (d) further comprising mapping adjacent received bits alternately onto less and more significant bits of a constellation using a second permutation.

8. The method of claim 7, wherein said first permutation is defined as:

$$i = \frac{N'_{CBPS}}{r}(k \bmod r) + \left\lfloor \frac{k}{r} \right\rfloor \text{ where } k = 0, 1, \ldots N'_{CBPS} - 1;$$

and said second permutation is defined as:

$$j = s\left\lfloor \frac{i}{s} \right\rfloor + \left(i + N'_{CBPS} - \left\lfloor \frac{ri}{N'_{CBPS}} \right\rfloor\right) \bmod s$$

where $i = 0, 1 \ldots N'_{CBPS} - 1;$ wherein,
r is the number of columns in the matrix;
k denotes the index of the bit before the first permutation;
i denotes the index after the first but before the second permutation;
j denotes the index after the second permutation; and
$N'_{CBPS}$ is the number of coded bits per sub carrier.

9. The method of claim 1, wherein at least four tones and one stream separation is introduced between adjacent bits received in step a) and transmitted in step g).

10. The method of claim 1, wherein successive bits are modulated onto alternate streams.

11. The method of claim 1, wherein in step d) said pre-determined number of bits is the number of bits per tone.

12. The method of claim 1, wherein rotating said group of sub-symbols in step f) increases separation between adjacent bits.

13. A system to process transmission data comprising:
    a) means for receiving bits;
    b) means for writing said received bits row-by-row in a matrix;
    c) means for reading said bits written row-by-row in said matrix column-by-column;
    d) means for grouping a pre-determined number of said bits read column-by-column to form subsymbols;
    e) means for grouping said subsymbols to form groups of subsymbols;
    f) means for rotating said groups of subsymbols to form rotated groups of subsymbols;
    g) means for transmitting said rotated groups of subsymbols over transmit paths;
    wherein adjacent received bits are separated over frequency, position, and multiple streams when transmitted.

14. The system of claim 13, wherein adjacent bits received are separated over frequency, position, and multiple streams, and over one symbol period when transmitted.

15. The system of claim 13, wherein a size of said matrix ($N'_{CBPS}$) is defined as:

$$N'_{CBPS} = N_{SS} \times K \times B;$$

wherein,
$N_{SS}$ is the number of streams;
K is the number of tones/stream and
B is the number of bits/tone.

16. The system of claim 13, wherein a number of columns (r) in said matrix is greater than or equal to 17 and less than or equal to 47.

17. The system of claim 13, wherein a number of columns (r) in said matrix is 24.

18. The system of claim 13, further comprising means for introducing at least four tones and one stream separation between adjacent bits received when transmitted.

19. A system to process transmission data comprising:
    a) a hardware module configured to receive bits;
    b) a hardware module configured to write said received bits row-by-row in a matrix;
    c) a hardware module configured to read said bits written row-by-row in said matrix column-by-column;
    d) a hardware module configured to group a pre-determined number of said bits read column-by-column to form subsymbols;
    e) a hardware module configured to group said subsymbols to form groups of subsymbols;
    f) a hardware module configured to rotate said groups of subsymbols to form rotated groups of subsymbols;

g) a hardware module configured to transmit said rotated groups of subsymbols over transmit paths;

wherein adjacent received bits are separated over frequency, position, and multiple streams when transmitted.

20. The system of claim 19, wherein adjacent received bits are separated over frequency, position, and multiple streams, and over one symbol period when transmitted.

* * * * *